United States Patent
Wu et al.

(10) Patent No.: US 11,264,088 B2
(45) Date of Patent: *Mar. 1, 2022

(54) SEMICONDUCTOR MEMORY WITH RESPECTIVE POWER VOLTAGES FOR MEMORY CELLS

(71) Applicant: TAIWAN SEMICONDUCTOR MANUFACTURING CO., LTD., Hsinchu (TW)

(72) Inventors: Wei-Cheng Wu, Hsinchu (TW); Chih-Yu Lin, Taichung (TW); Kao-Cheng Lin, Taipei (TW); Wei-Min Chan, New Taipei (TW); Yen-Huei Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/997,857

(22) Filed: Aug. 19, 2020

(65) Prior Publication Data

US 2020/0381043 A1  Dec. 3, 2020

Related U.S. Application Data

(63) Continuation of application No. 15/991,739, filed on May 29, 2018, now Pat. No. 10,783,954, which is a
(Continued)

(51) Int. Cl.
*G11C 11/419* (2006.01)
*G11C 11/413* (2006.01)
(Continued)

(52) U.S. Cl.
CPC .......... *G11C 11/419* (2013.01); *G11C 11/412* (2013.01); *G11C 11/413* (2013.01); *H01L 27/11* (2013.01)

(58) Field of Classification Search
CPC ... G11C 11/419; G11C 11/413; G11C 11/412; G11C 11/417; G11C 5/063; G11C 5/147; G11C 7/12; G11C 8/08; H01L 27/11
See application file for complete search history.

(56) References Cited

U.S. PATENT DOCUMENTS

| 6,151,259 A | 11/2000 | Hori |
| 7,606,104 B2 | 10/2009 | Nagatani et al. |

(Continued)

FOREIGN PATENT DOCUMENTS

| CN | 1750171 A | 3/2006 |
| CN | 1870175 A | 11/2006 |

(Continued)

*Primary Examiner* — Sultana Begum
(74) *Attorney, Agent, or Firm* — Maschoff Brennan

(57) ABSTRACT

A device is disclosed that includes a plurality of first memory cells, a plurality of second memory cells, a power circuit, and a header circuit. The power circuit is configured to provide a first power voltage via a conductive line for the plurality of first memory cells, and to provide a second power voltage, that is independent from the first power voltage, for the plurality of second memory cells. The header circuit is configured to provide, during the write operation, the first voltage smaller than the first power voltage, the second power voltage, or smaller than the first power voltage and the second power voltage, for corresponding memory cells of the plurality of first memory cells via the conductive line and for corresponding memory cells of the plurality of second memory cells. A circuit structure of the power circuit is different from a circuit structure of the header circuit.

20 Claims, 7 Drawing Sheets

US 11,264,088 B2
Page 2

Related U.S. Application Data continuation of application No. 15/336,633, filed on Oct. 27, 2016, now Pat. No. 9,997,235.

(60) Provisional application No. 62/269,057, filed on Dec. 17, 2015.

(51) Int. Cl.
  *H01L 27/11* (2006.01)
  *G11C 11/412* (2006.01)

(56) References Cited

U.S. PATENT DOCUMENTS

| | | | |
|---|---|---|---|
| 8,004,907 | B2 | 8/2011 | Russell et al. |
| 9,218,872 | B1 | 12/2015 | Liaw |
| 2003/0189221 | A1 | 10/2003 | Takemura |
| 2006/0056229 | A1 | 3/2006 | Maeda |
| 2009/0135663 | A1 | 5/2009 | van Winkelhoff et al. |
| 2009/0141569 | A1 | 6/2009 | Nii et al. |
| 2009/0273961 | A1* | 11/2009 | Ono .............. G11C 13/00 365/51 |
| 2010/0157692 | A1 | 6/2010 | Wang |
| 2010/0182865 | A1 | 7/2010 | Wu |
| 2011/0273952 | A1 | 11/2011 | Nii et al. |
| 2012/0044779 | A1* | 2/2012 | Chuang .............. G11C 11/412 365/226 |
| 2013/0250694 | A1 | 9/2013 | Kutsukake |
| 2014/0050017 | A1 | 2/2014 | Otto et al. |
| 2014/0133219 | A1 | 5/2014 | Wu et al. |
| 2015/0063047 | A1 | 3/2015 | Choi |
| 2015/0109873 | A1 | 4/2015 | Pilo et al. |
| 2015/0117119 | A1 | 4/2015 | Guo |
| 2016/0254045 | A1 | 9/2016 | Mazumder |
| 2017/0194041 | A1 | 7/2017 | Kim |

FOREIGN PATENT DOCUMENTS

| | | |
|---|---|---|
| CN | 101826365 A | 9/2010 |
| KR | 10-2014-0188844 | 12/2014 |

* cited by examiner

SEMICONDUCTOR MEMORY WITH RESPECTIVE POWER VOLTAGES FOR MEMORY CELLS

PRIORITY CLAIM AND CROSS-REFERENCE

This application is a continuation of U.S. application Ser. No. 15/991,739, filed May 29, 2018, which is a continuation of U.S. application Ser. No. 15/336,633, filed Oct. 27, 2016, now U.S. Pat. No. 9,997,235 issued on Jun. 12, 2018, which claims priority to U.S. Provisional Application Ser. No. 62/269,057, filed Dec. 17, 2015, all of which are herein incorporated by reference.

BACKGROUND

Semiconductor memory devices include, for example, static random access memory (SRAM), and dynamic random access memory (DRAM). In some approaches, a SRAM device includes a SRAM array, and the SRAM array includes memory cells. The memory cells typically include transistors that are coupled to bit lines and word lines. The bit lines and word lines are used to read data from and write data to the memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
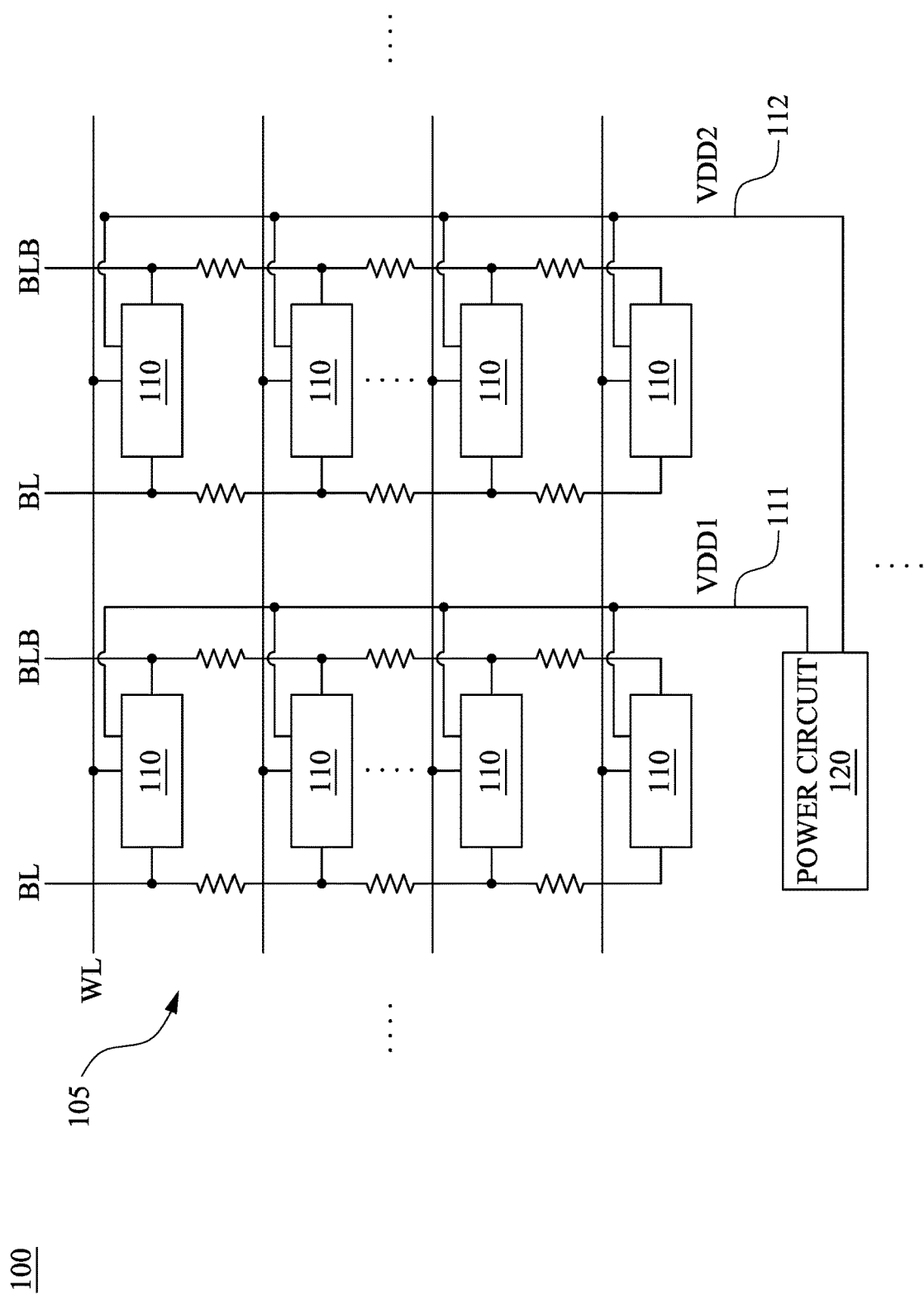
FIG. 1A is a schematic diagram of a static random access memory (SRAM) device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1A is a schematic diagram of a static random access memory (SRAM) device 100 in accordance with some embodiments of the present disclosure. As illustratively shown in FIG. 1A, the SRAM device 100 includes memory cells 110. For illustration, the memory cells 110 are arranged in columns and rows in a memory cell array 105. Each column of the memory cells 110 is connected to a pair of bit lines BL and BLB. Each row of the memory cells 110 is connected to a corresponding word line WL.

In some embodiments, a group of the memory cells 110 is connected to one of power lines including power lines 111 and 112. For illustration, one column of the memory cells 110 is connected to the power line 111, another column of the memory cells 110 is connected to the power line 112, and so on. Two columns of the memory cells 110 and the power lines 111 and 112 are illustrated in FIG. 1A, but they are given for illustrative purposes. Various numbers of columns of memory cells and power lines are within the contemplated scope of the present disclosure. Various conductive lines to implement the power lines including power lines 111 and 112 are within the contemplated scope of the present disclosure as well.

In some embodiments, the power lines including the power lines 111 and 112 are electrically disconnected from one another. For illustration, the power line 111 is electrically disconnected and/or independent from the power line 112 and other power lines (not shown), and the power line 112 is electrically disconnected and/or independent from other power lines, and so on.

For illustration, the power line 111 is configured to be applied with a power voltage VDD1, the power line 112 is configured to be applied with a power voltage VDD2, and the power voltage VDD1 is independent from the power voltage VDD2. The power voltages VDD1 and VDD2 are the same in some embodiments, and alternatively, they are different in various embodiments.

Figure 1B:
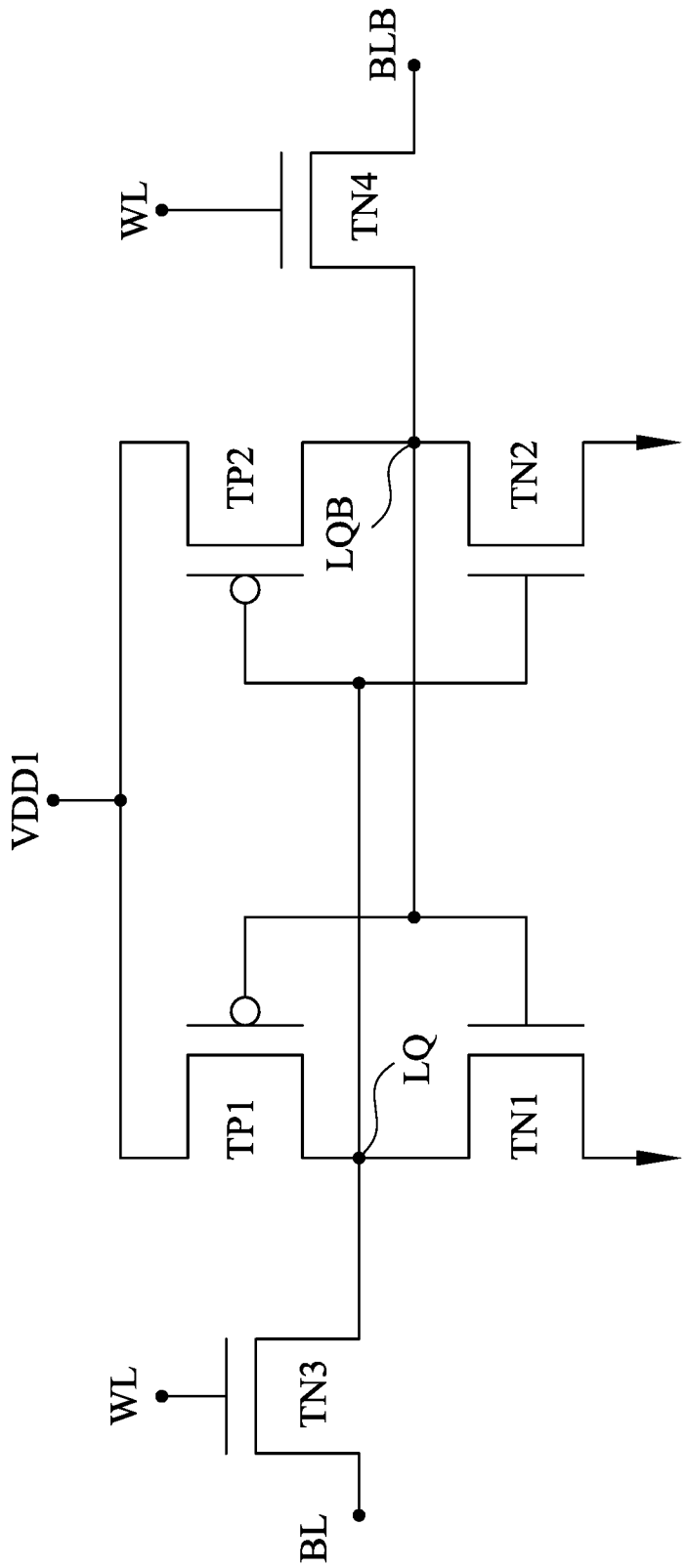
FIG. 1B is a circuit diagram of one memory cell of the SRAM device in FIG. 1A, in accordance with some embodiments of the present disclosure.

FIG. 1B is a circuit diagram of one memory cell 110 of the SRAM device 100 in FIG. 1A, in accordance with some embodiments of the present disclosure. For illustration in FIG. 1B, the memory cell 110 includes two pass-gate transistors TN3 and TN4, two pull-up transistors TP1 and TP2, and two pull-down transistors TN1 and TN2.

The pass-gate transistors TN3 and TN4 are connected to the corresponding word line WL and connected to the corresponding bit lines BL and BLB, respectively. The pass-gate transistors TN3 and TN4 are controlled by the corresponding word line WL, and receive data at the corresponding bit lines BL and BLB, respectively. The pull-up transistors TP1 and TP2 are connected to, and operate with, a corresponding power line (e.g., power line 111), in order to receive, for example, the power voltage VDD1.

The pull-up transistor TP1 and the pull-down transistor TN1 operate together as an inverter, and the pull-up transistor TP2 and the pull-down transistor TN2 operate together as another inverter. For illustration in FIG. 1B, the inverter including the transistors TP1 and TN1 and the inverter including the transistors TP2 and TN2 are cross-coupled at internal nodes LQ and LQB. The pull-up transistors TP1 and TP2 and pull-down transistors TN1 and TN2 in each memory cell 110 function together as a data latch for storing the received data.

For illustration of operation with respect to FIG. 1B, the data latch including the transistors TP1, TP2, TN1 and TN2 is able to store logic data at the internal node LQ. The voltage level of the internal node LQ represents logic "1" or logic "0" corresponding to the logic data stored in the memory cell 110. The internal node LQB has a logic that is opposite to that of the internal node LQ.

Various circuits or devices to implement the transistors in each memory cell 110 are within the contemplated scope of the present disclosure. Moreover, additional circuits or devices are able to be added in the memory cells 110 to control access and/or operation of the transistors.

In addition, the configuration, or the number of transistors, of each memory cell 110, discussed above, is given for illustrative purposes. Various configurations, or numbers of transistors, of each memory cell 110, are within the contemplated scope of the present disclosure. Alternatively stated, the memory cell 110 in this document has multiple variations. For example, 6-transistor (6T), 8-transistor (8T), 12-transistor (12T) and 14-transistor (14T) are commonly used in SRAM structures. One of ordinary skill in the art will realize that the aforementioned description is given for illustrative purposes.

As illustratively shown in FIG. 1A, in some embodiments, the SRAM device 100 further includes a power circuit 120. The power circuit 120 is connected to the power lines including the power lines 111 and 112. For illustration, the power circuit 120 is configured to provide the power voltages VDD1 and VDD2 through the power lines 111 and 112, respectively, for the corresponding memory cells 110.

In various embodiments, each one of the power lines in FIG. 1A is connected to an independent power circuit. The configuration of the power circuit 120 associated with the power lines in FIG. 1A is given for illustrative purposes. Various configurations of one or more power circuits associated with power lines are within the contemplated scope of the present disclosure.

In alternative embodiments, the SRAM device 100 includes no power circuit discussed above. Each one of the power lines in FIG. 1A is connected to a power supply through no power circuit discussed above.

In some approaches, power lines associated with columns of memory cells are connected together by metal lines formed in row direction, thus forming a power mesh. With the power mesh, transistors in the memory cells operate with strong power voltages. The strong power voltages affect internal nodes (e.g., the nodes LQ and LQB shown in FIG. 1B) that are connected to the transistors receiving the strong power voltages in the memory cells. Accordingly, during write operation, the internal nodes cannot be pulled, for example, based on data at corresponding bit lines, to having predetermined voltage levels, because of the strong power voltages. As a result, write operation of the memory cells cannot be performed well.

Compared to the aforementioned approaches, the power lines associated with the memory cells 110 in the present disclosure are electrically independent and electrically disconnected from one another. For illustration in FIG. 1A, the power lines including the power lines 111 and 112, associated with the columns of memory cells 110, are not connected together by metal lines formed in row direction. Accordingly, no power mesh is formed in the SRAM device 100 of the present disclosure. As a result, write operations of the memory cells 110 of the present disclosure are able to be performed without being affected by power mesh which is used in other approaches.

Figure 2A:
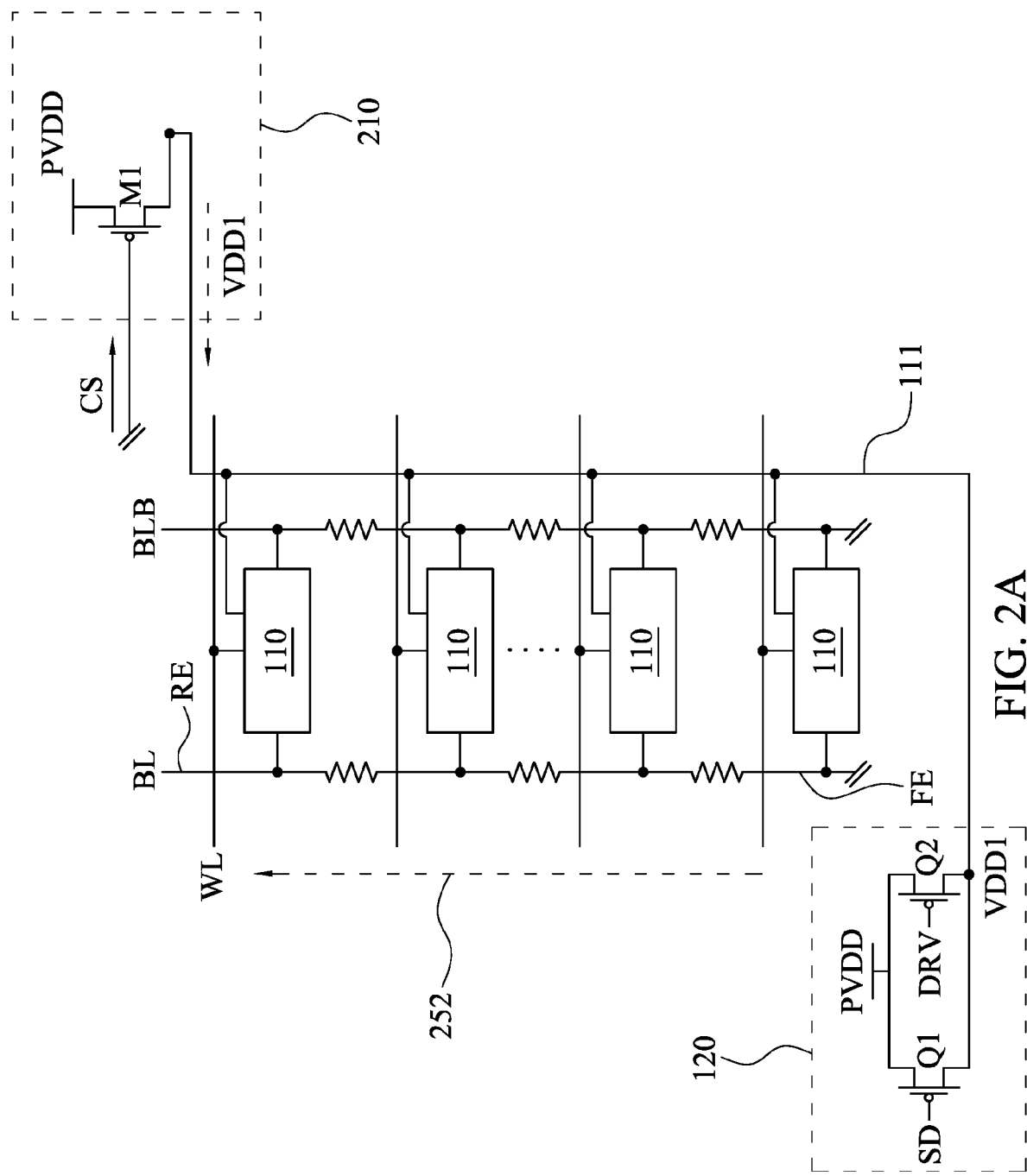
FIG. 2A is a schematic diagram of the SRAM device in FIG. 1A, including circuits associated with memory cells, in accordance with some embodiments of the present disclosure.

FIG. 2A is a schematic diagram of the SRAM device 100 in FIG. 1A, including circuits associated with the memory cells 110, in accordance with some embodiments of the present disclosure. For simplicity, circuits associated with the power lines other than the power line 111 are not shown in FIG. 2A. Corresponding circuits associated with other columns of the memory cells and other power lines are within the contemplated scope of the present disclosure.

In some embodiments, the SRAM device 100 in FIG. 2A further includes a header circuit 210. The header circuit 210 is connected to the power line 111. The header circuit 210 is configured to selectively provide the power voltage VDD1 through the power line 111, for the memory cells 110. For illustration, when the memory cells 110 are not in write operation, the header circuit 210 is activated and provides a supply voltage PVDD as the power voltage VDD1 for the memory cells 110. In some embodiments, VDD1 is smaller than PVDD as explained below. During write operation of the memory cells 110, the header circuit 210 is deactivated and accordingly provides no voltage, or zero voltage, for the memory cells 110.

Figure 2B:
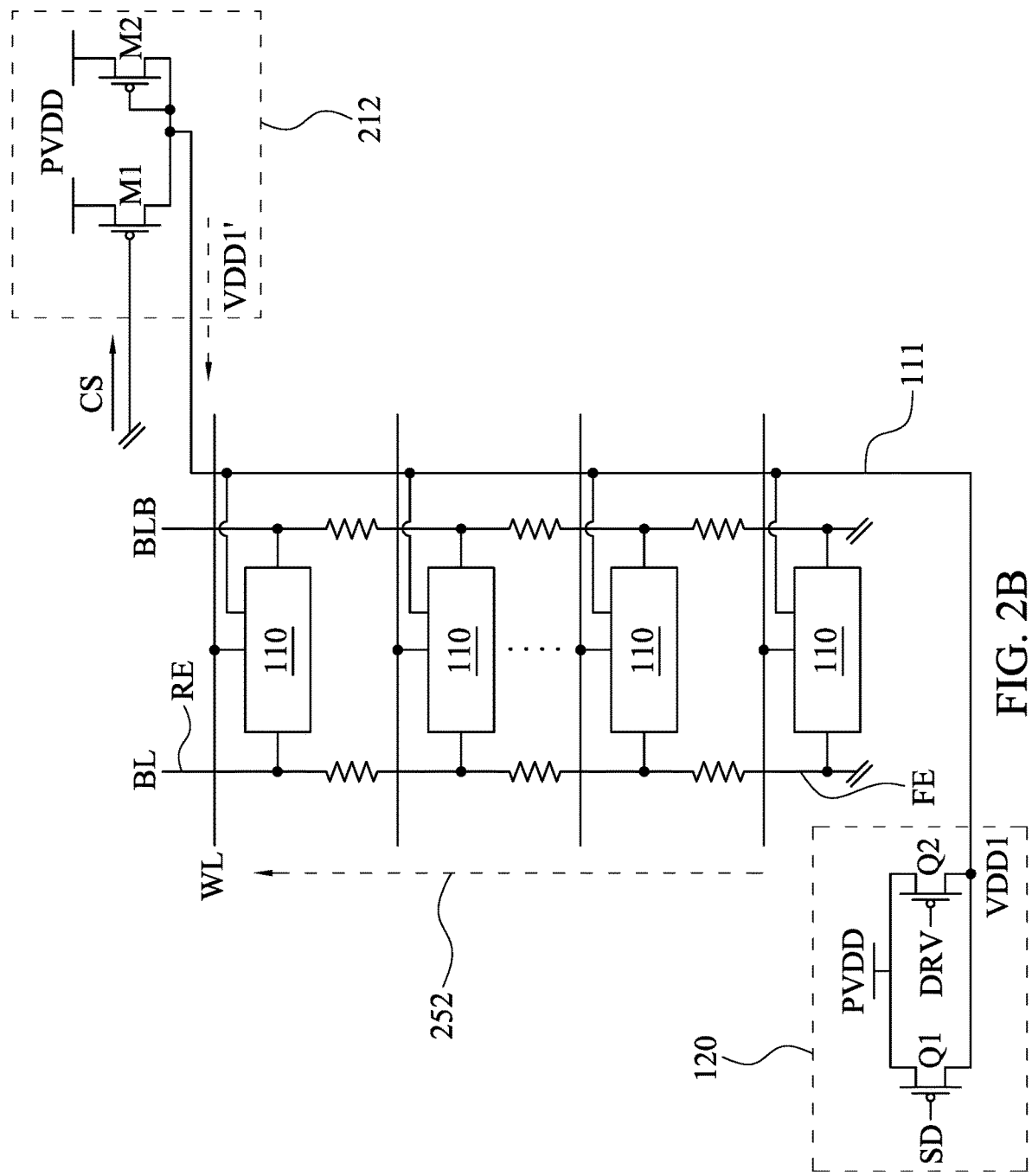
FIG. 2B is a schematic diagram of the SRAM device 100 in FIG. 1A, including circuits associated with the memory cells 110, in accordance with various embodiments of the present disclosure.

The above configuration of the header circuit 210 is given for illustrative purposes. Various configurations of the header circuit 210 are within the contemplated scope of the present disclosure. For example, in various embodiments, during write operation of the memory cells 110, the header circuit 210 is configured to provide another power voltage VDD1' (as shown in FIG. 2B) that is smaller than the supply voltage PVDD and the power voltage VDD1.

In some embodiments, the header circuit 210 is controlled by a control signal CS. For illustration, the header circuit 210 is deactivated by the control signal CS, and accordingly, the header circuit 210 provides no voltage for the memory cells 110. Detailed operations of the header circuit 210 associated with the memory cells 110 in FIG. 2A will be explained with reference to FIG. 3 and FIG. 4.

The control signal CS is generated, in some embodiments, by an independent control circuit (not shown). Alternatively, in some other embodiments, the control signal CS is generated in response to the data signals on the bit lines BL and BLB, as will be illustrated with reference to FIG. 5.

In various embodiments with reference to FIG. 2A, the header circuit 210 is configured to electrically connect or disconnect the power line 111 and a supply voltage PVDD. For illustration, during write operation, the header circuit 210 is configured to electrically disconnect the power line 111 from the supply voltage PVDD in response to the control signal CS. When the power line 111 is electrically disconnected from the supply voltage PVDD, the header circuit 210 provides no voltage through the power line 111, for the memory cells 110. On the other hand, when the header circuit 210 electrically connects the power line 111 with the supply voltage PVDD, the supply voltage PVDD is provided, through the header circuit 210, as the power voltage VDD1 for the memory cells 110.

Although the memory cells 110 in FIG. 2A are illustrated as a single column of memory cells connected to a single header circuit 210, it is understood that FIG. 2A is given for illustrative purposes. In some embodiments, additional header circuits, functioning in the same manner as the header circuit 210 in FIG. 2A, are used and connected to the power lines including the power lines 111 and 112 in FIG. 1A. Alternatively, in various embodiments, the power lines including the power lines 111 and 112 in FIG. 1A are connected to the single header circuit 210 in FIG. 2A.

For illustration in FIG. 2A, in some embodiments, the header circuit 210 includes a switch M1 that is implemented with, for example, a PMOS transistor. The switch M1 is connected between the supply voltage PVDD and the power line 111. For illustration of operation, when the switch M1 is turned on by the control signal CS, the power voltage VDD1 is generated according to the supply voltage PVDD through the switch M1. Accordingly, the power line 111 is applied with the generated power voltage VDD1. During write operation, the switch M1 is turned off by the control signal CS, and therefore, the switch M1 electrically disconnects the power line 111 from the supply voltage PVDD. With the switch M1 electrically disconnecting the power line 111 from the supply voltage PVDD, no voltage is provided through the switch M1 and the power line 111 to the memory cells 110.

FIG. 2B is a schematic diagram of the SRAM device 100 in FIG. 1A, including circuits associated with the memory cells 110, in accordance with various embodiments of the present disclosure. With respect to the embodiments of FIG. 2A, like elements in FIG. 2B are designated with the same reference numbers for ease of understanding.

In various embodiments, compared to the embodiments illustrated in FIG. 2A, the header circuit 212 in FIG. 2B further includes a switch M2 that is implemented with, for example, a PMOS transistor. The switch M2 is diode-connected between the supply voltage PVDD and the power line 111. For illustration in FIG. 2B, one terminal (e.g., the source) of the switch M2 is connected to the supply voltage PVDD, and a control terminal (e.g., the gate) and the other terminal (e.g., the drain) of the switch M2 are connected together and to the power line 111 and one terminal (e.g., the drain) of the switch M1.

For illustration of operation, when the switch M1 is turned on, the supply voltage PVDD is provided through the switch M1 to the drain of the switch M1, as discussed above. Further, as shown in FIG. 2B, the drain of the switch M1 is coupled to the gate and the drain of the switch M2, which serve as the control terminal of the switch M2. Because the control terminal of the switch M2 receives the supply voltage PVDD in conjunction with the switch M1 being turned on, the switch M2 is turned off. On the other hand, during write operation, the switch M1 is turned off, and accordingly no supply voltage PVDD is provided through the switch M1 to the power line 111, as discussed above. Without the voltage provided through the switch M1 to the power line 111, the control terminal of the switch M2 receives no generated voltage instantaneously. However, the switch M2 is turned on and off alternately until the switch M2 operatively functions as a diode. In such a condition, the switch M2 provides a retained power voltage VDD1' at the power line 111. In some embodiments, the retained power voltage VDD1' at the power line 111 is smaller than the supply voltage PVDD, which is a voltage being equal to the supply voltage PVDD minus the voltage dropped through the switch M2. In various embodiments, the retained power voltage VDD1' is also smaller than the power voltage VDD1 in FIG. 2A. With the switch M2 functioning as a diode and providing the retained power voltage VDD1' at the power line 111, when the switch M1 is turned off, a large sudden power voltage drop at the power line 111 is able to be prevented.

The above configurations and operations of the header circuits 210 and 212 in FIG. 2A and FIG. 2B, respectively, are given for illustrative purposes. Various configurations and operations of the header circuits 210 and 212 are within the contemplated scope of the present disclosure.

The power circuit 120 is a power management circuit in some embodiments. In such embodiments, the power circuit 120 is configured to provide various power voltages and/or operated in various states. In some embodiments, the power circuit 120 provides various power voltages including the power voltage VDD1 as discussed above, during write operation. In some other embodiments, the power circuit 120 provides no power voltages during write operation.

For illustration in FIG. 2A, in some embodiments, the power circuit 120 includes PMOS transistors Q1 and Q2. The transistor Q1 is connected between the power line 111 and the supply voltage PVDD, and is controlled by a control signal SD. The transistor Q2 is connected between the power line 111 and the supply voltage PVDD, and controlled by a control signal DRV.

In operation, when the power circuit 120 is in a normal state, the transistors Q1 and Q2 are turned on by the control signals SD and DRV, respectively. Accordingly, the power circuit 120 provides the power voltage VDD1 transited from the supply voltage PVDD through the transistors Q1 and Q2, for the memory cells 110. When the power circuit 120 is in a retention state, the transistor Q1 is turned off by the control signals SD, and the transistor Q1 receives the control signal DRV with a level of the power voltage VDD1. When the power circuit 120 is in a shut down state, the transistors Q1 and Q2 are turned off by the control signals SD and DRV, respectively.

The above configurations and operations of the power circuit 120 in FIG. 2A and FIG. 2B are given for illustrative purposes. Various configurations and operations of the power circuit 120 are within the contemplated scope of the present disclosure.

Figure 3:
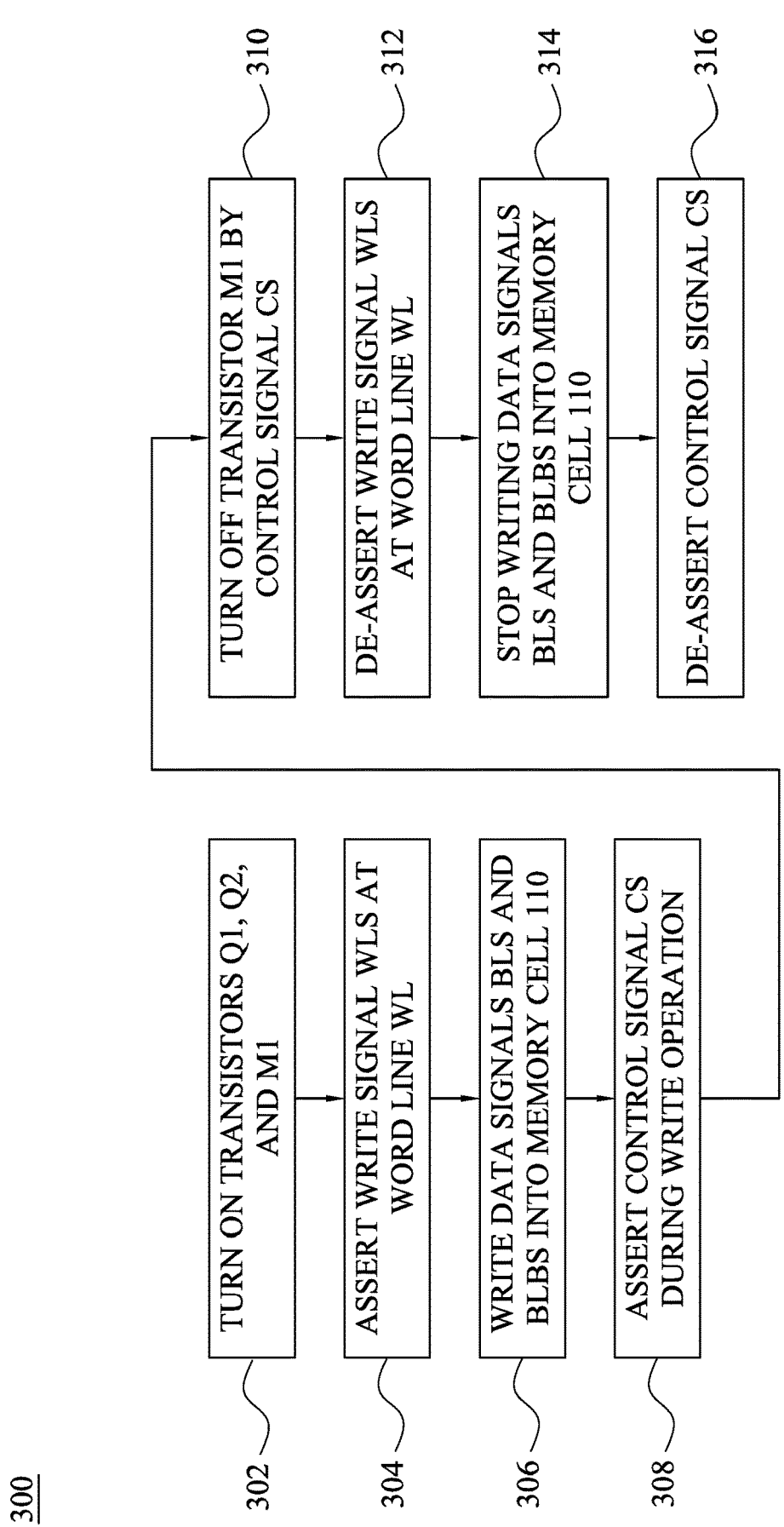
FIG. 3 is a flow chart of a method illustrating operations of the SRAM device in FIG. 2A, in accordance with some embodiments of the present disclosure.
Figure 4:
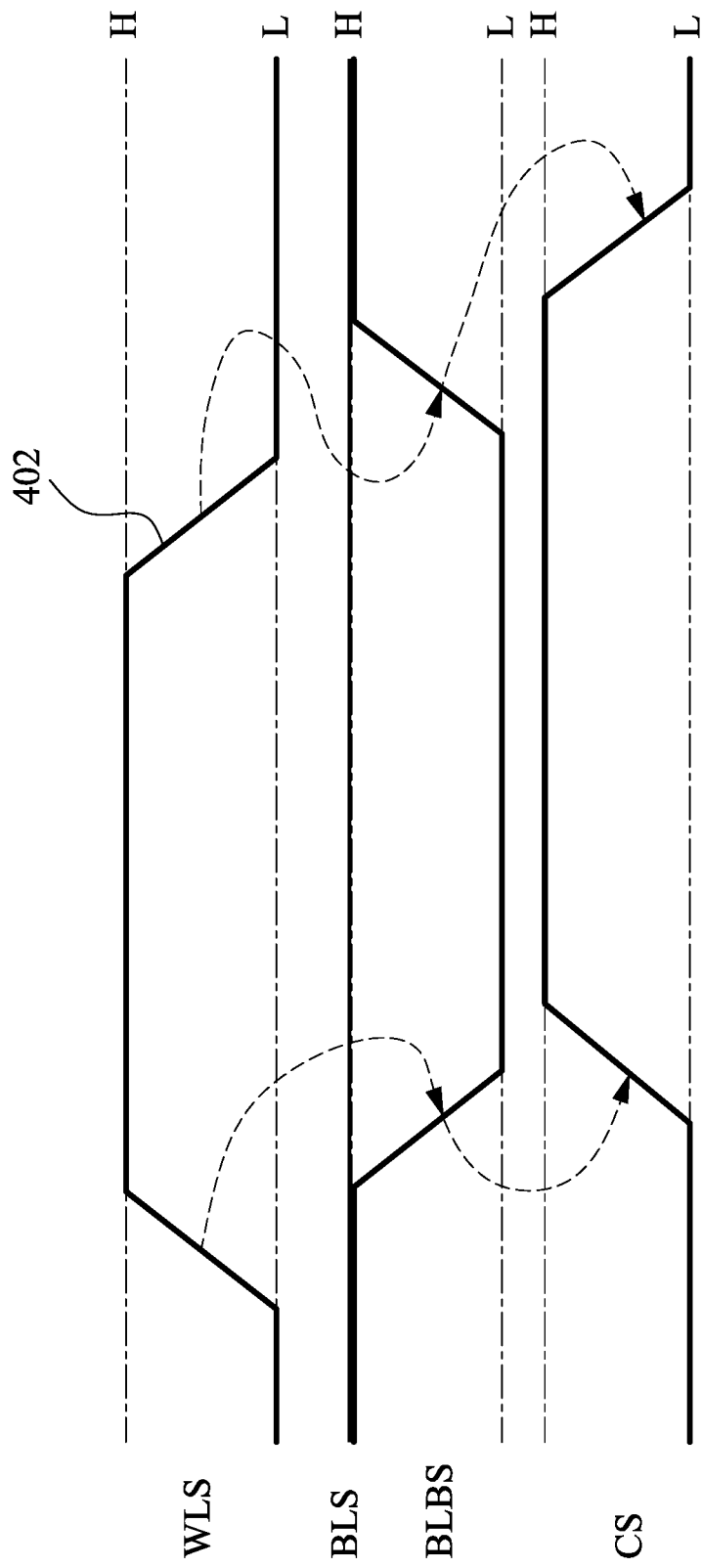
FIG. 4 is a schematic timing diagram of signals applied in the SRAM device in FIG. 2A, in accordance with some embodiments of the present disclosure.

FIG. 3 is a flow chart of a method 300 illustrating operations of the SRAM device 100 in FIG. 2A, in accordance with some embodiments of the present disclosure. FIG. 4 is a timing diagram of signals applied to the SRAM device 100 in FIG. 2A, in accordance with some embodiments of the present disclosure. For illustration, "WLS" in FIG. 4 indicates a write signal transmitted on the word line WL in FIG. 2A, and "BLS/BLBS" in FIG. 4 indicates data signals transmitted on the bit lines BL and BLB, respectively, in FIG. 2A. Moreover, "H" in FIG. 4 indicates a logic high level, and "L" in FIG. 4 indicates a logic low level.

Operations of the SRAM device 100 in FIG. 2A are described by the method 300 in FIG. 3 with reference to FIG. 4. For simplicity, following operations are explained with reference to the memory cell 110 which is connected to the word line, for example, labeled as "WL" in FIG. 2A.

Operations associated with other memory cells 110 are similar and are within the contemplated scope of the present disclosure.

In operation 302, the transistors Q1, Q2, and M1 are turned on. Accordingly, the power voltage VDD1, that is transited through the transistors Q1 and Q2 from the supply voltage PVDD, and transited through the transistor M1 from the supply voltage PVDD, is provided through the power line 111 for the memory cell 110. Having the power voltage VDD1, the memory cell 110 is ready to perform write and/or read operation.

In operation 304, when write operation is to be performed, the write signal WLS is asserted at the word line WL. For illustration in FIG. 4, the write signal WLS is transited from the "L" state to the "H" state.

In operation 306, based on the asserted write signal WLS, the data signals BLS and BLBS are written into the memory cell 110 through the bit lines BL and BLB, respectively. For illustration in FIG. 4, the data signal BLS at the bit line BL is in the "H" state, and the data signal BLBS at the bit line BLB is transited from the "H" state to the "L" state. In such a condition, other word lines corresponding to unselected memory cells 110 are applied with a logic low signal, and the unselected memory cells 110 retain their values.

In operation 308, the control signal CS is asserted during write operation. For illustration in FIG. 4, based on the transition of the data signal BLBS from the "H" state to the "L" state, the control signal CS is transited from the "L" state to the "H" state.

In operation 310, the transistor M1 is turned off by the control signal CS. Alternatively stated, the header circuit 210 in FIG. 2A is deactivated. Accordingly, the power line 111 is electrically disconnected from the supply voltage PVDD through the turn-off transistor M1. As a result, the memory cell 110, which is connected to the word line WL labeled in FIG. 2A, stops receiving the power voltage VDD1 from the transistor M1. Explained in a different way, for illustration, during write operation, the pull-up transistors TP1 and TP2 in the memory cell 110 illustrated in FIG. 1B stop receiving the power voltage VDD1 from the transistor M1 in FIG. 2A. Accordingly, the power voltage VDD1 from the transistor M1 would not affect the internal nodes LQ and LQB that are connected to the pull-up transistors TP1 and TP2.

Moreover, the memory cell 110, for example, associated with a rear end RE of the bit line BL and the word line labeled WL in FIG. 2A, operates with the power voltage VDD1, from the power circuit 120, having intrinsic voltage drop according to resistance on the power line 111. With intrinsic voltage drop on the power line 111, the power voltage VDD1 on the power line 111 gradually decreases in a direction 252. Accordingly, the power voltage VDD1 has gradually decreasing effect, in the direction 252, on the memory cells 110. Due to the decreasing effect on the memory cells 110, the pull-up transistors TP1 and TP2 and the associated internal nodes LQ and LQB as illustrated in FIG. 1B, for example, in the memory cell 110 that is associated with the rear end RE of the bit line BL and the word line WL, are able to operate well without strong effect of the power voltage VDD1. Accordingly, the internal nodes LQ and LQB are able to be pulled to having predetermined voltage levels during write operation. As a result, write operation of the memory cell 110 is performed well.

On the other hand, in other approaches, data signal at bit line could deteriorate because of IR drop (i.e., voltage drop) generated according to resistance on the bit line. For illustration in FIG. 2A, data signal at the bit line BL could deteriorate in the direction 252 because of IR drop generated according to resistance on the bit line BL. The direction 252 indicates that, for example, the data signal is transmitted from a front end FE to the rear end RE of the bit line BL. In such approaches, the voltage corresponding to the data signal on the bit line BL decreases gradually, for example, in the direction 252 in FIG. 2A. Moreover, in related approaches, there is no header circuit as discussed above. Accordingly, the memory cells 110 are continuously affected by the power voltage VDD1 in related approaches. As a result, the memory cell 110, for example, associated with the rear end RE of the bit line BL, performs unreliable write operation with the data signal having a decreasing voltage and a continuous power voltage in related approaches.

Compared to the aforementioned approaches, the header circuit 210 is arranged in the SRAM device 100 of the present disclosure, and is deactivated during write operation. For illustration in FIG. 2A, the transistor M1 is turned off by the control signal CS during write operation, to electrically disconnect the memory cells 110 from the supply voltage PVDD. Accordingly, the memory cells 110 do not receive the power voltage VDD1, generated from the supply voltage PVDD, during write operation, as discussed above. Without being affected by the power voltage VDD1, the memory cell 110, for example, associated with the rear end RE of the bit line BL and the word line labeled WL in FIG. 2A, is able to perform reliable write operation while the memory cell 110 receives, through the bit line BL and/or BLB, the data signal having a decreasing voltage. Alternatively stated, when the memory cell 110, for illustration, associated with the rear end RE of the bit line BL in FIG. 2A, receives the data signal having a decreasing voltage, write operation of the memory cell 110 is compensated, for illustration, by electrically disconnecting the memory cell 110 from the supply voltage PVDD, or alternatively, by providing zero voltage or the retained power voltage VDD1' that is smaller than the aforementioned power voltage VDD1, for the memory cell 110, as discussed above.

Afterwards, when write operation is to be finished, operation 312 is then performed. In operation 312, the write signal WLS on the word line WL is de-asserted. For illustration in FIG. 4, the write signal WLS is transited from the "H" state to the "L" state, in which this transition 402 is labeled in FIG. 4.

In operation 314, based on the de-asserted write signal WLS, the data signals BLS and BLBS stop being written into the memory cell 110. In such a condition, for illustration in FIG. 4, the data signal BLS at the bit line BL is still in H state, and the data signal BLBS at the bit line BLB is transited from the "L" state to the "H" state.

In operation 316, the control signal CS is de-asserted. For illustration in FIG. 4, based on the transition of the data signal BLBS from the "L" state to the "H" state, the control signal CS is transited from the "H" state to the "L" state. Accordingly, the transistor M1 is turned on again in response to the de-asserted control signal CS.

In some embodiments, the control signal CS is de-asserted after write operation of the memory cells 110 is finished. Explained in a different way, for illustration in FIG. 4, after the write signal WLS on the word line WL is de-asserted, the control signal CS is still maintained in the "H" state for a while. When the write signal WLS is maintained in the "L" state, then the control signal CS is transited from the "H" state to the "L" state, to make sure that the write operation of the memory cells 110 is reliable.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Moreover, the operations of the SRAM device 100, as discussed above, are given for illustrative purposes. Various operations of the SRAM device 100 are within the contemplated scope of the present disclosure. For example, in various embodiments, the header circuit 210 in FIG. 2A and the header circuit 212 in FIG. 2B are also applicable in read operation of the memory cells 110 in the present disclosure.

Figure 5:
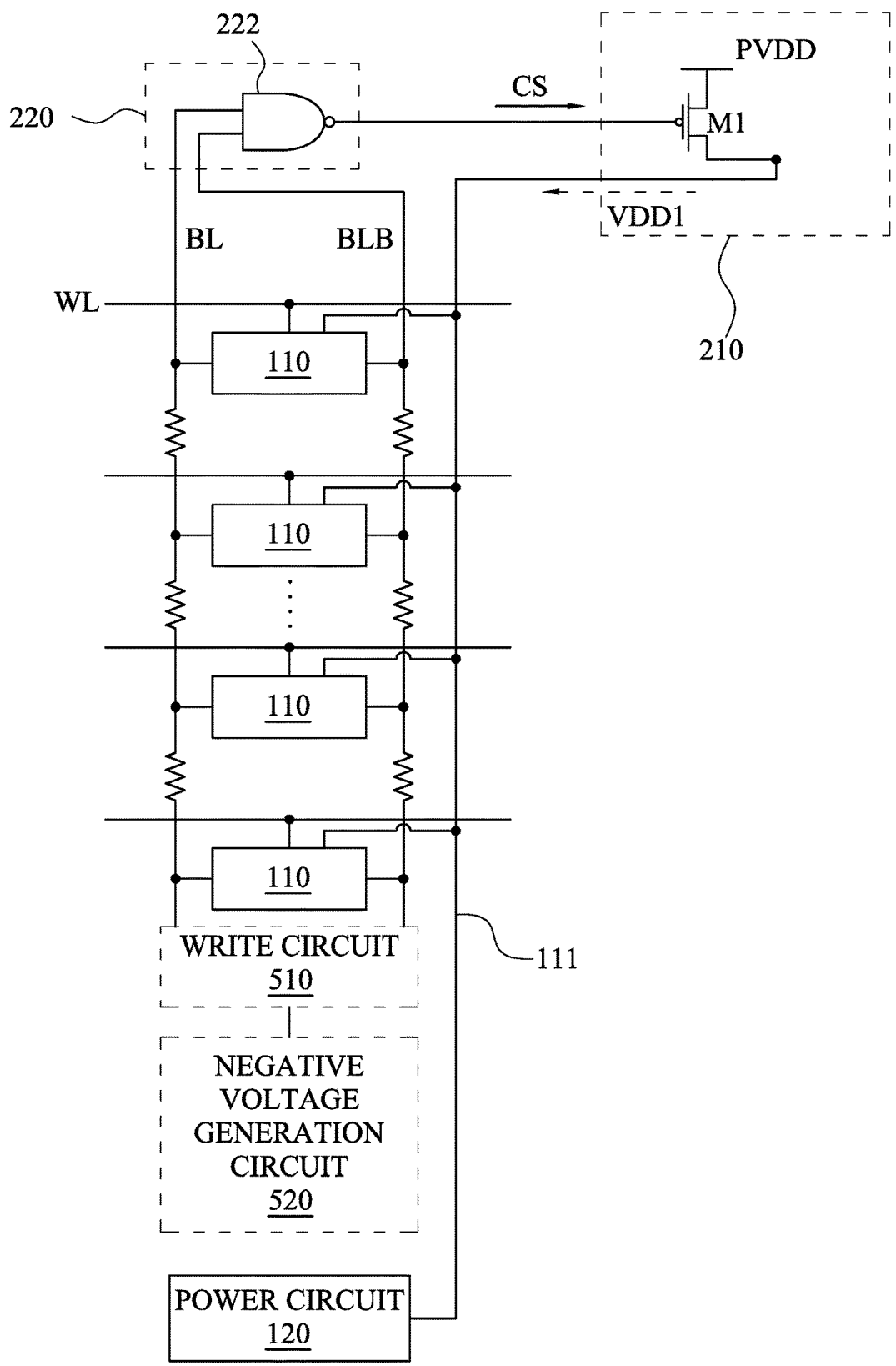
FIG. 5 is a schematic diagram of the SRAM device in FIG. 1A, including various circuits associated with memory cells, in accordance with various embodiments of the present disclosure.

FIG. 5 is a schematic diagram of the SRAM device 100 in FIG. 1A, including various circuits associated with the memory cells 110, in accordance with alternative embodiments of the present disclosure. With respect to the embodiments of FIG. 2A, like elements in FIG. 5 are designated with the same reference numbers for ease of understanding.

Compared to FIG. 2A, in some embodiments, the SRAM device 100 in FIG. 5 further includes a control circuit 220. The control circuit 220 is connected to the bit lines BL and BLB and the header circuit 210. The control circuit 220 is configured to output the control signal CS, based on the data signals asserted at the bit lines BL and BLB and received by the memory cells 110.

In some embodiments, the control circuit 220 includes a NAND gate 222. Two inputs of the NAND gate 222 are connected to the bit lines BL and BLB, and an output of the NAND gate 222 is connected to the control terminal of the switch M1. The NAND gate 222 is configured to receive complementary data signals asserted at the bit lines BL and BLB, and generate the control signal CS during write operation.

For illustration with reference to FIG. 4 and FIG. 5, the NAND gate 222 performs NAND operation of the data signals BLS and BLBS. During write operation, the data signal BLS is in the "H" state and the data signal BLBS is in the "L" state, and thus the NAND gate 222 generates the control signal CS which is in the "H" state. Accordingly, the switch M1 is turned off by the control signal CS during write operation. By using the NAND gate 222 to detect the data signals BLS and BLBS at the bit lines BL and BLB, respectively, the header circuit 210 (or the switch M1) in the SRAM device 100 of FIG. 5 is able to be controlled by the SRAM device 100 itself. Alternatively stated, the data signals BLS and BLBS at the bit lines BL and BLB, respectively, are trackable, for the control of the header circuit 210 (or the switch M1). External timing control signal and/or external control mechanism for the header circuit 210 (or the switch M1) is not required in such embodiments.

The configuration of the control circuit 220 in FIG. 5 is given for illustrative purposes. Various configurations of the control circuit 220 for generating the control signal CS based on data signals at the bit lines BL and BLB are within the contemplated scope of the present disclosure. Alternatively stated, various digital circuits, analog circuits, or the combination thereof, designed to implement the control circuit 220 for generating the control signal CS based on data signals at the bit lines BL and BLB, are within the contemplated scope of the present disclosure.

In addition, various configurations of the control circuit 220 for generating the control signal CS, without using data signals at the bit lines BL and BLB, are within the contemplated scope of the present disclosure as well.

As illustratively shown in FIG. 5, in various embodiments, the SRAM device 100 further includes a write circuit 510. The write circuit 510 is connected to the bit lines BL and BLB. During write operation of the memory cells 110, by the write circuit 510, the data signal indicating a logic value to be written is provided at the bit line BL, and the data signal indicating the complement of the same logic value is provided at the bit line BLB.

In further embodiments, the SRAM device 100 in FIG. 5 further includes a negative voltage generation circuit 520, and the negative voltage generation circuit 520 is operated with the write circuit 510. For illustration, when the write circuit 510 provides complementary data signals at the bit lines BL and BLB, the negative voltage generation circuit 520 provides negative voltages for the bit line BL or BLB. With the negative voltages, voltage levels of the data signals at the bit lines BL and BLB are pulled down to a negative voltage level, which, for example, is lower than the level of the "L" state. Each one of the memory cells 110 receives the data signals being pulled down with a fast transition. Accordingly, in each one of the memory cells 110, the transistors associated with the bit line BL or BLB are able to operate more quickly and correctly, compared to approaches without negative voltages for the bit line BL or BLB, based on the fast transition of the data signals with negative voltages, thus, for example, improving the speed and stability of write operation.

Correspondingly, when the negative voltage drop is generated on the bit line BL or BLB by using the negative voltage generation circuit 520, the negative voltage drop on the bit line BL or BLB is also able to be tracked, for illustration, by the NAND gate 222, as discussed above.

The above embodiments illustrated with respect to FIG. 5 are given for illustrative purposes. Various configurations of the embodiments illustrated with respect to FIG. 5 are within the contemplated scope of the present disclosure. For example, in various embodiments, the header circuit 210 in FIG. 5 is replaced by the header circuit 212 illustrated in FIG. 2B.

In some embodiments, at least one of the switches M1, M2, Q1, and Q2 discussed above is implemented with at least one metal oxide semiconductor (MOS) transistor, at least one bipolar junction transistor (BJT), etc., or the combination thereof. The devices to implement the switches in this document are given for illustrative purposes. Various devices to implement the switches in this document are within the contemplated scope of the present disclosure.

Moreover, in further embodiments, by using at least one MOS transistor to implement at least one of the switches M1, M2, Q1, and Q2, as discussed above, each one of the at least one MOS transistor is implemented with stacked MOS transistors or cascaded MOS transistors. In various embodiments, each one of the at least one MOS transistor is controlled by one or more control signals.

In this document, the term "coupled" may also be termed as "electrically coupled", and the term "connected" may be termed as "electrically connected". "Coupled" and "connected" may also be used to indicate that two or more elements cooperate or interact with each other.

In some embodiments, a device is disclosed that includes a plurality of first memory cells, a plurality of second memory cells, a power circuit, and a header circuit. The power circuit is configured to provide a first power voltage via a conductive line for the plurality of first memory cells, and to provide a second power voltage, that is independent from the first power voltage, for the plurality of second memory cells. The header circuit is configured to provide, during the write operation, the first voltage smaller than the first power voltage, the second power voltage, or smaller than the first power voltage and the second power voltage, for corresponding memory cells of the plurality of first memory cells via the conductive line and for corresponding memory cells of the plurality of second memory cells. A circuit structure of the power circuit is different from a circuit structure of the header circuit.

Also disclosed is a device that includes a plurality of memory cells, a control circuit, at least one switch, and a voltage generation circuit. The control circuit is configured to generate a control signal that is associated with data signals received by the memory cells. The at least one switch is coupled between a supply voltage and the memory cells, and is configured to be turned on in response to the control signal during the write operation, to provide the first voltage smaller than a power voltage from a power circuit, for the plurality of memory cells. The voltage generation circuit is configured to generate at least one negative voltage signal on at least one data line that is coupled to the plurality of memory cell.

Also disclosed is a method that includes generating a power voltage by a power circuit to provide the power voltage for memory cells, generating a control signal that is associated with data signals received by memory cells, and during the write operation of memory cells, controlling at least one switch to turn on in response to the control signal, to provide the first voltage that is smaller than the power voltage, for the memory cells, in which a circuit structure of the power circuit is different from a circuit structure of the header circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a plurality of first memory cells and a plurality of second memory cells;
   a power circuit configured to provide a first power voltage via a conductive line for the plurality of first memory cells, and to provide a second power voltage, that is independent from the first power voltage, for the plurality of second memory cells; and
   a header circuit configured to provide, during a write operation, a first voltage smaller than the first power voltage, the second power voltage, or smaller than the first power voltage and the second power voltage, for corresponding memory cells of the plurality of first memory cells via the conductive line and for corresponding memory cells of the plurality of second memory cells,
   wherein a circuit structure of the power circuit is different from a circuit structure of the header circuit.

2. The device of claim 1, wherein a number of switches in the power circuit is different from a number of switches in the header circuit.

3. The device of claim 2, wherein the header circuit comprises:
   a first switch connected between a first end of the conductive line and a supply voltage, and configured to be turned off during the write operation.

4. The device of claim 3, wherein the power circuit comprises:
   a second switch; and
   a third switch, wherein the second switch and the third switch are connected in parallel between the supply voltage and a second end of the conductive line.

5. The device of claim 3, further comprising:
   a control circuit configured to receive data signals that are received by the plurality of first memory cells, and configured to generate, based on the received data signals, a control signal for turning off the first switch.

6. The device of claim 5, wherein the control circuit comprises:
   a NAND gate configured to receive the data signals, and configured to generate the control signal.

7. The device of claim 1, further comprising:
   a control circuit configured to control, based on data signals received by the plurality of first memory cells, the header circuit to provide the first voltage.

8. The device of claim 7, wherein the control circuit comprises:
   a NAND gate configured to receive the data signals, and configured to generate a control signal for controlling the header circuit.

9. A device comprising:
   a plurality of memory cells;
   a control circuit configured to generate a control signal that is associated with data signals received by the plurality of memory cells;
   at least one switch coupled between a supply voltage and the plurality of memory cells, and configured to be turned on in response to the control signal during a write operation, to provide a first voltage smaller than a power voltage from a power circuit, for the plurality of memory cells; and
   a voltage generation circuit configured to generate at least one negative voltage signal on at least one data line that is coupled to the plurality of memory cells.

10. The device of claim 9, wherein the at least one switch comprises:
    a first switch configured to be turned off during the write operation, to electrically disconnect the plurality of memory cells from the supply voltage; and
    a second switch configured to be turned on during the write operation to provide the first voltage, wherein the second switch is diode-connected between the plurality of memory cells and the supply voltage.

11. The device of claim 10, wherein the control circuit is configured to receive the data signals that are received by the plurality of memory cells and is configured to generate, in response to the data signals, the control signal for turning off the first switch.

12. The device of claim 11, wherein the control circuit comprises:
    a NAND gate configured to receive the data signals, and configured to generate the control signal during the write operation.

13. The device of claim 11, wherein the data signals are a pair of complementary signals.

14. The device of claim 9, wherein the power circuit and the at least one switch are connected to two ends of a conductive line, respectively.

15. The device of claim 9, wherein the first voltage is approximately equal to the supply voltage minus a voltage dropped through the at least one switch.

16. A method comprising:
   generating a power voltage by a power circuit to provide the power voltage;
   generating a control signal that is associated with data signals received by memory cells; and
   during a write operation of the memory cells, controlling at least one switch in a header circuit to turn on in response to the control signal, to provide a first voltage that is smaller than the power voltage, for the memory cells,
   wherein a circuit structure of the power circuit is different from a circuit structure of the header circuit.

17. The method of claim 16, wherein a number of switches in the power circuit is different from a number of switches in the header circuit.

18. The method of claim 17, wherein the power circuit and the header circuit are connected to two ends of a conductive line, respectively.

19. The method of claim 16, wherein generating the control signal comprises:
   performing a NAND operation on the data signals, to generate the control signal.

20. The method of claim 16, further comprising:
   in response to the control signal, disconnecting the memory cells from a supply voltage by controlling the at least one switch to turn off.

* * * * *